(12) United States Patent
Iwata et al.

(10) Patent No.: US 11,016,233 B2
(45) Date of Patent: May 25, 2021

(54) OPTICAL WAVEGUIDE STRUCTURE, PHOSPHOR ELEMENT, AND METHOD FOR MANUFACTURING OPTICAL WAVEGUIDE STRUCTURE

(71) Applicant: NGK INSULATORS, LTD., Nagoya (JP)

(72) Inventors: Yuichi Iwata, Nagoya (JP); Jungo Kondo, Miyoshi (JP); Shoichiro Yamaguchi, Ichinomiya (JP)

(73) Assignee: NGK INSULATORS, LTD., Nagoya (JP)

(*) Notice: Subject to any disclaimer, the term of this patent is extended or adjusted under 35 U.S.C. 154(b) by 0 days.

(21) Appl. No.: 16/880,446

(22) Filed: May 21, 2020

(65) Prior Publication Data

US 2020/0278485 A1 Sep. 3, 2020

Related U.S. Application Data

(63) Continuation of application No. PCT/JP2018/033066, filed on Sep. 6, 2018.

(30) Foreign Application Priority Data

Nov. 21, 2017 (JP) .............. JP2017-223494

(51) Int. Cl.
*F21V 8/00* (2006.01)
*C23C 28/00* (2006.01)
(Continued)

(52) U.S. Cl.
CPC ............ *G02B 6/0001* (2013.01); *C23C 4/134* (2016.01); *C23C 14/08* (2013.01); *C23C 28/345* (2013.01);
(Continued)

(58) Field of Classification Search
CPC .... G02B 6/0001; G02B 6/0003; G02B 6/122; G02B 2006/12097; G02B 2006/12104;
(Continued)

(56) References Cited

U.S. PATENT DOCUMENTS 5,677,113 A * 10/1997 Suzuki ............... G03F 7/42
134/1
8,685,596 B2 4/2014 Gao et al.
(Continued)

FOREIGN PATENT DOCUMENTS

JP 8148703 A 6/1996
JP 2009139920 A 6/2009
(Continued)

OTHER PUBLICATIONS

Parsons et al., "Effect of an Oxygen Plasma on Uncoated Thin Aluminum Reflecting Films", May 1987, NASA Technical Memorandum 89882, 16 Pages.*
(Continued)

*Primary Examiner* — Alan B Cariaso
(74) *Attorney, Agent, or Firm* — Flynn Thiel, P.C.

(57) ABSTRACT

An optical waveguide structure includes an optical waveguide, a reflection film provided on the optical waveguide and reflecting a light propagating in the optical waveguide, a metal film provided on the reflection film, and a surface oxidized film provided on the metal film and generated by surface oxidation of the metal film.

11 Claims, 8 Drawing Sheets

(51) Int. Cl.
  *G02B 1/14* (2015.01)
  *C23C 4/134* (2016.01)
  *C23C 14/08* (2006.01)
  *G02B 6/122* (2006.01)
  *F21S 41/24* (2018.01)
  *F21S 41/176* (2018.01)
  *F21S 41/39* (2018.01)

(52) U.S. Cl.
  CPC ............... *G02B 1/14* (2015.01); *F21S 41/176* (2018.01); *F21S 41/24* (2018.01); *F21S 41/39* (2018.01); *G02B 6/0003* (2013.01); *G02B 6/122* (2013.01)

(58) Field of Classification Search
  CPC .......... G02B 2006/12121; G02B 2006/12123; G02B 1/10; G02B 1/14; F21S 41/176; F21S 41/24; F21S 41/39; C23C 28/345; C23C 28/3455; C23C 14/08; C23C 14/081; C23C 4/134
  See application file for complete search history.

(56) References Cited

U.S. PATENT DOCUMENTS

| | | | |
|---|---|---|---|
| 9,316,372 B2 | 4/2016 | Harada | |
| 2006/0063264 A1* | 3/2006 | Turner | G01N 21/6452 436/8 |
| 2008/0253728 A1 | 10/2008 | Sparacin et al. | |
| 2011/0210094 A1* | 9/2011 | Gray | G02B 6/122 216/12 |
| 2015/0316466 A1* | 11/2015 | Hirai | C23C 14/081 250/343 |
| 2016/0342282 A1* | 11/2016 | Wassvik | G02F 1/13338 |
| 2017/0292182 A1* | 10/2017 | Hamaya | C23C 4/134 |
| 2019/0310408 A1 | 10/2019 | Kondo et al. | |

FOREIGN PATENT DOCUMENTS

| | | |
|---|---|---|
| JP | 2010282770 A | 12/2010 |
| JP | 2014116081 A | 6/2014 |
| JP | 2016154063 A | 8/2016 |
| JP | 2017188399 A | 10/2017 |
| JP | 6367515 B1 | 8/2018 |
| WO | 2014203488 A1 | 12/2014 |
| WO | 2017006797 A1 | 1/2017 |
| WO | 2017183606 A1 | 10/2017 |

OTHER PUBLICATIONS

NGK Insulators, Ltd., "Translation PCT Written Opinion of the International Searching Authority", dated Nov. 21, 2017, pp. 1-6.*
Japanese language Written Opinion for PCT/JP2018/033066, dated Nov. 27, 2018 (4 pages).
Japanese language International Search Report for PCT/JP2018/033066, dated Nov. 27, 2018 (3 pages).

* cited by examiner

OPTICAL WAVEGUIDE STRUCTURE, PHOSPHOR ELEMENT, AND METHOD FOR MANUFACTURING OPTICAL WAVEGUIDE STRUCTURE

CROSS-REFERENCE TO RELATED APPLICATIONS

This application is a continuation application of PCT/JP2018/033066, filed Sep. 6, 2018, which claims priority to Japanese Application No. 2017-223494, filed Nov. 21, 2017, the entire contents all of which are incorporated hereby by reference.

TECHNICAL FIELD

The present invention relates to an optical waveguide structure, phosphor element and a method of manufacturing an optical waveguide structure.

BACKGROUND ARTS

Recently, intensive study has been undertaken in headlights for a vehicle employing a laser light source, and one thereof is a white light source constructed by combining blue laser or ultraviolet laser and a phosphor. A light density of excitation light can be increased by condensing laser light, and, moreover, a light intensity of the excitation light can also be increased by condensing multiple beams of laser light so as to overlap on the phosphor. As a result, light flux and brightness can simultaneously be increased without changing a light emission area. Therefore, a white light source that combines semiconductor laser and a phosphor with each other is attracting attention as a light source that replaces the LED. For example, as phosphor glass used for the vehicle headlight, phosphor glass "Lumiphous™" from Nippon Electric Glass and YAG monocrystal phosphors from National Institute for Materials Science, Tamura Corporation, and Koha Co., Ltd. are proposed.

According to Patent Document 1, a non-reflection film for excitation light and a total reflection film for fluorescence are formed on an incident surface of an optical waveguide in a flat plate shape. The fluorescence that has been oscillated in the optical waveguide and has returned to the incident surface side can be reflected at the total reflection film on the incident surface, and can be emitted from an emission surface side.

Moreover, reflection films are formed on side faces of a flat plate type transmissive phosphor, thereby preventing fluorescent from being emitted from the side faces of the flat plate type phosphor according to Patent Document 2.

CITATION LIST

Patent Document

PATENT DOCUMENT 1: WO 2014-203488A1
PATENT DOCUMENT 2: JP 2014-116081A

SUMMARY OF THE INVENTION

However, there are limits on the light densities of the fluorescence and the excitation light in an element that causes the excitation light to propagate through the phosphor in a flat plate shape, thereby generating fluorescence.

Thus, the inventors tried to form a ridge type optical waveguide with a phosphor and to produce a device emitting fluorescence. However, as a phsosphor device is actually produced, it is proved that fluorescence is leaked from a side face of the ridge type optical waveguide so that fluorescence directing toward a desired direction cannot be sufficiently obtained. That is, as excited light is irradiated at phosphor particles in the optical waveguide and fluorescence is emitted from the phosphor particles, the fluorescence is emitted from the phosphor particles in every direction. As a result, much of the fluorescence propagates toward the side face and incident face of the optical waveguide, so that a sufficiently high fluorescence output toward the desired direction is not obtained.

Thus, the inventors studied to provide a reflection film to cover the side face of the optical waveguide. However, as a phosphor device is actually produced, it is proved that the reflection film is partly peeled or disappeared and fluorescence is leaked from the peeled or disappeared part of the reflection film, which is problematic.

An object of the present invention is, in an optical waveguide structure having a reflection film on an optical waveguide, to suppress the local peeling or disappearance of the reflection film and to prevent the resulting leakage of propagating light to the outside of the optical waveguide.

The present invention provides an optical waveguide structure comprising:
an optical waveguide;
a reflection film provided on the optical waveguide and reflecting a light propagating in the optical waveguide;
a metal film provided on the reflection film; and
a surface oxidized film provided on the metal film and by surface oxidation of the metal film.

The present invention further provides a fluorescence generating device comprising the optical waveguide structure, wherein the optical waveguide comprises a phosphor propagating an excitation light to generate fluorescence.

The present invention further provides a method of producing an optical waveguide structure, the method comprising:
obtaining a part comprising an optical waveguide, a reflection film provided on the optical waveguide and reflecting a light propagating in the optical waveguide, and a metal film provided on the reflection film; and
subjecting the metal film of the part to surface oxidation treatment to generate a surface oxidized film on a surface of the metal film.

The inventors studied the cause of local disappearance of the reflection film provided on the optical waveguide and reached the following findings.

That is, for producing a chip of an optical waveguide device with an optical waveguide provided therein, it is necessary to use ultrapure water and to maintain super clean state in dicing and cleaning steps. However, there is the problem that the reflection film on the optical waveguide is corroded in contact with the ultrapure water and is partly disappeared, so that the function as the reflection film is not available.

Then, the inventors tried to oxidize the reflection film on the waveguide for avoiding the disappearance due to the corrosion. In this case, the reflectance of light propagating in the optical waveguide is reduced. Further, it is tried to provide an oxide film composed of alumina or silica as a protection film on the refection film to prevent the corrosion of the reflective film. In this case, it is effective to prevent the corrosion of the reflective film during the cleaning step. However, it is proved that the reflection film was peeled in the vicinity of the end face due to a load of a processing blade during the step of polishing the end face of the device, and that the function as the protection film is not available.

Further, the inventors tried to form a metal film on the reflection film as a protection film. In this case, it is proved that the peeling as the protection film composed of the oxide does not occur and that the metal film is partly disappeared due to the corrosion.

Based on the findings, the inventors tried the method of forming a metal film on the reflection film, of oxidizing a surface of the metal film by an oxidizing process such as plasma asking and of forming a surface oxidized film composed of an oxide of the metal. It is thus found that the disappearance of the reflection film and the metal film formed thereon due to the corrosion can be prevented and, at the same time, the peeling of the metal film and reflection film during the polishing step of the end face of the optical waveguide can be suppressed to thereby prevent the leakage of light propagating in the optical waveguide. The present invention is thus made.

MODES FOR CARRYING OUT THE INVENTION

Figure 1A:
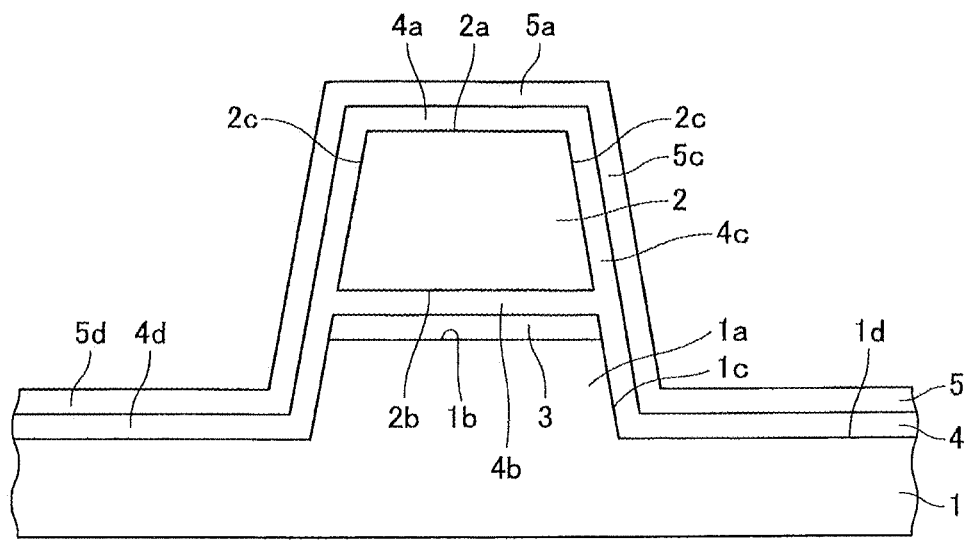
FIG. 1(a) is a cross sectional view showing the state that a clad layer 4 and reflection film 5 are formed on a surface of an optical waveguide 2.

The present invention will be further described below, appropriately referring to the drawings.

FIGS. 1 to 4 relate to an optical waveguide device according to an embodiment of the present invention.

Figure 2:
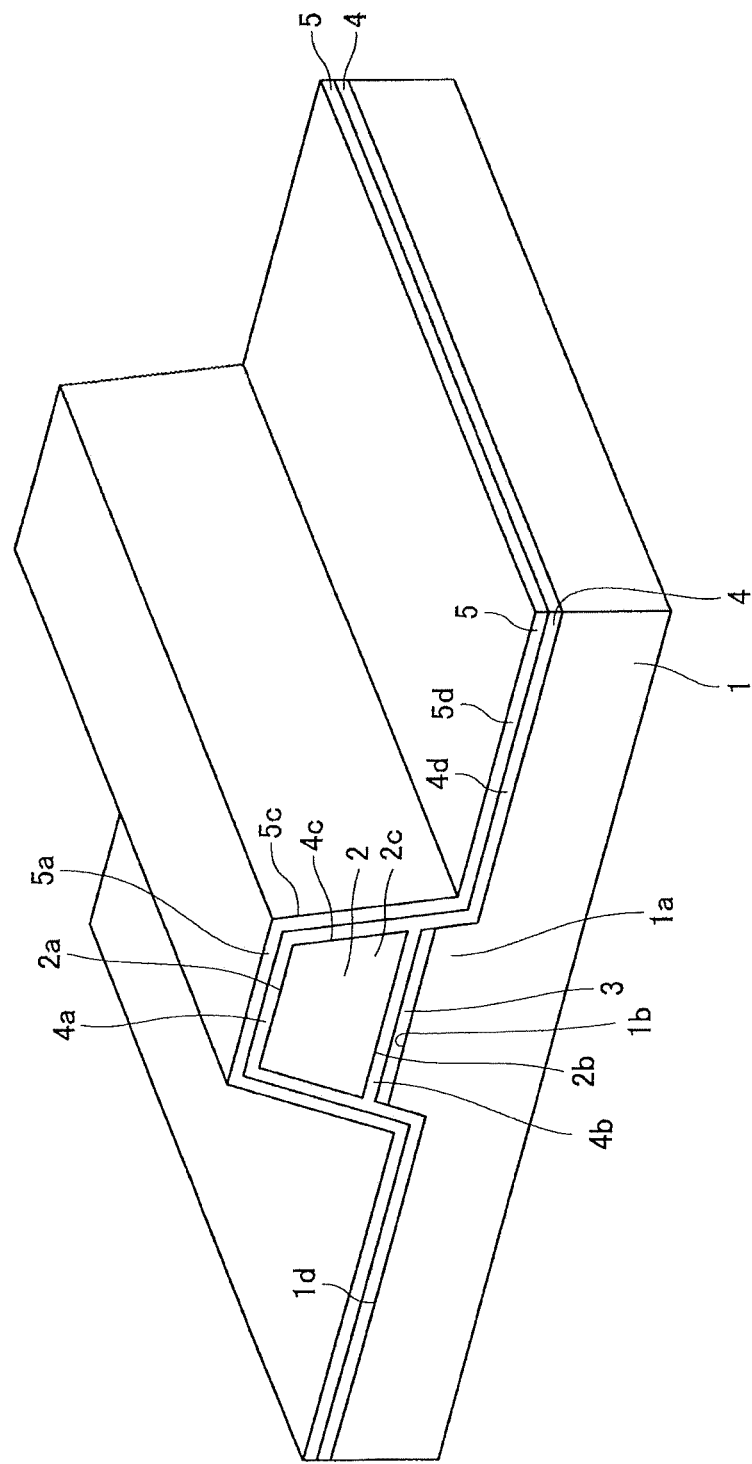
FIG. 2 is a perspective view showing the state that the clad layer 4 and reflection film 5 are formed on the surface of the optical waveguide 2.

As shown in FIGS. 1(a) and 2, one or plural protrusion(s) 1a are provided on a main face 1d of a supporting substrate 1. A ridge type optical waveguide 2 is formed on an upper face 1b of the protrusion 1a. According to the present example, the ridge type optical waveguide 2 is bonded with and fixed onto the protrusion 1a. A groove may be formed between a plurality of the adjacent protrusions.

According the present example, the ridge type optical waveguide 2 and supporting substrate 1 are covered with a clad layer 4 and reflection film 5 as a whole. That is, a reflection film 3 is formed on an upper face 1b of the protrusion 1a. Then, the clad layer 4 includes a main face-covering part 4d covering a main face 1d of the supporting substrate 1, a side face-covering part 4c covering a side face 1c of the protrusion 1a and a side face 2c of the optical waveguide 2, and an upper face-covering part 4a covering an upper face 2a of the optical waveguide 2. Further, the reflection film 5 also includes a main face-covering part 5d, a side face-covering part 5c and upper face-covering part 5a. According to the present example, the clad layer 4 includes a bottom face-covering part 4b between a reflection film 3 and bottom face 2b of the optical waveguide 2.

Figure 1B:
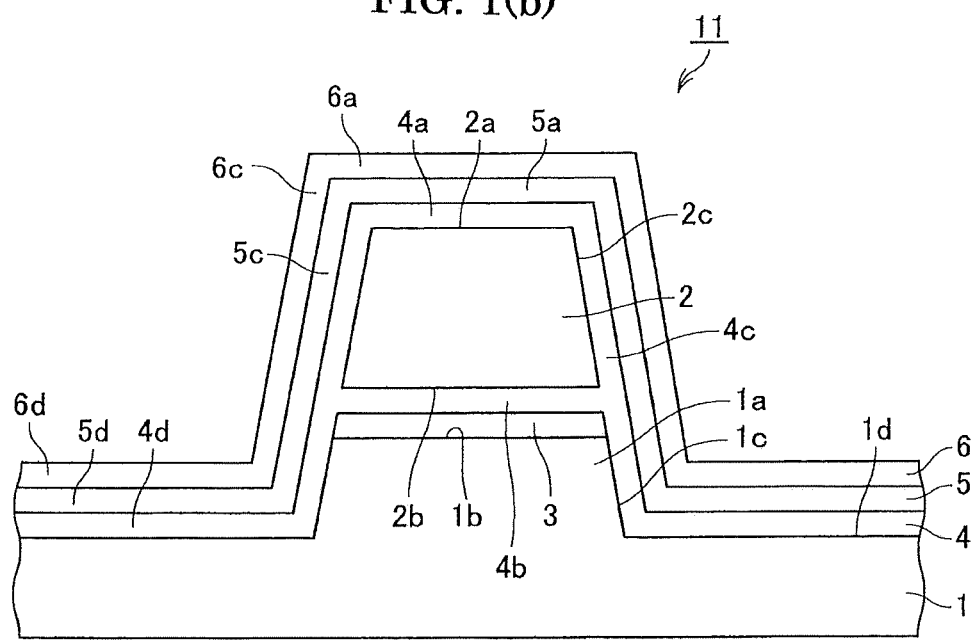
FIG. 1(b) is a cross sectional view showing the state that a metal film 6 is formed on the reflection film 5.

Then, as shown in FIG. 1(b), a metal film 6 is formed on the reflection film to obtain a part 11. According to the present example, the metal film 6 includes a main face-covering part 6d, side face-covering part 6c and upper face-covering part 6a.

Figure 3:
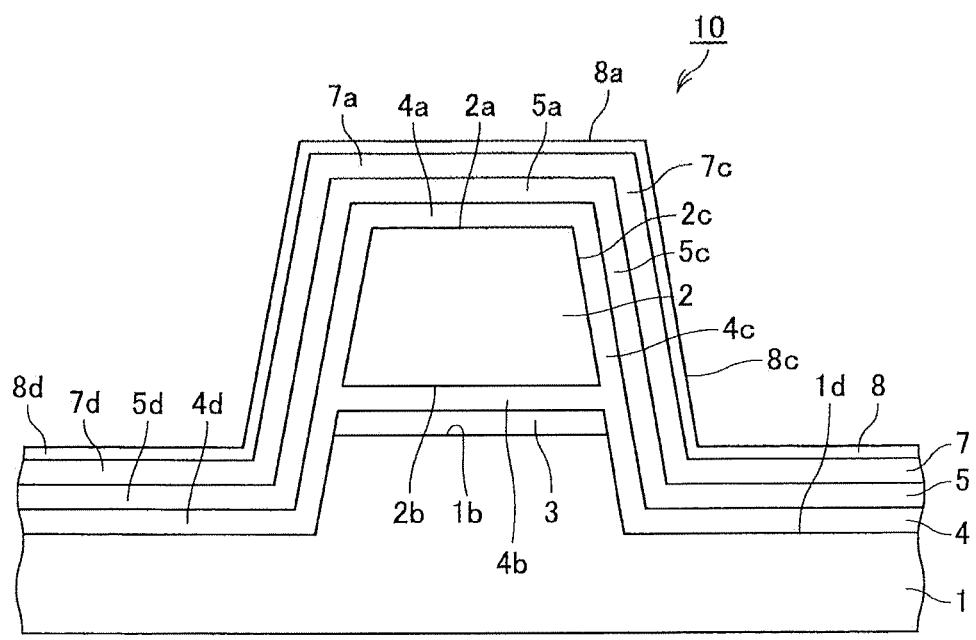
FIG. 3 is a cross sectional view showing the state that the metal film is subjected to surface oxidation to provide a surface oxidized film.
Figure 4:
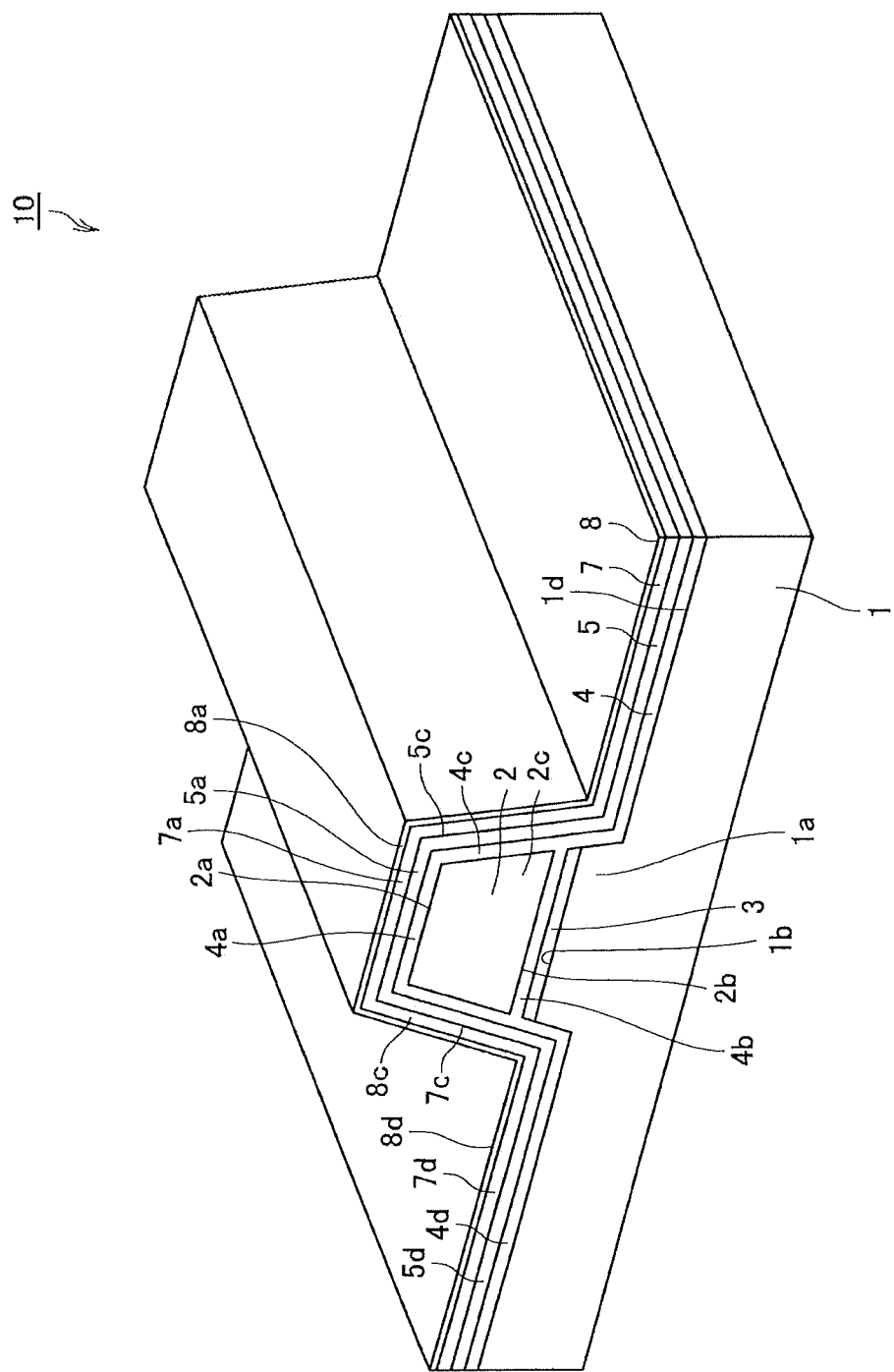
FIG. 4 is a perspective view showing the state that the metal film is subjected to surface oxidation to provide the surface oxidized film.

Then, as shown in FIGS. 3 and 4, a surface of the metal film 6 is oxidized to form a surface oxidized film 8 composed of an oxide of a metal forming the metal film 6. At this time, an intermediate metal film 7 is left between the surface oxidized film 8 and reflection film 5. As a result, in the thus obtained optical waveguide structure 10, the intermediate metal film 7 includes a main face-covering part 7d, side face-covering part 7c and upper face-covering part 7a, and the surface oxidized film 8 includes a main face-covering part 8d, side face-covering pat 8c and upper face-covering part 8a. Further, according to FIGS. 3 and 4, the clad layer 4, reflection film 5, intermediate metal film 7 and surface oxidized film 8 cover the main face 1d of the supporting substrate 1. As light does not propagate along the main face 1d of the supporting substrate 1, the clad layer 4, reflection film 5, intermediate metal film 7 and surface oxidized film 8 on the main face 1d may be omitted.

According to such optical waveguide structure, the disappearance of the reflection film and the metal film thereon due to the corrosion can be prevented by to the effect of the surface oxidized film 8. At the same time, the peeling of the metal film and reflection film can be suppressed during the polishing of the end face of the optical waveguide, so that the leakage of the light propagating in the optical waveguide can be prevented.

The constituents of the optical waveguide structure of the present invention will be further described below.

The specific material of the supporting substrate is not particularly limited, and includes lithiumniobate, lithium tantalate, a glass such quartz glass and quartz crystal. Further, for preventing the conduction of heat of a light source to the optical waveguide or for suppressing the heating of the optical waveguide itself due to the wavelength conversion or heat from the outside, it may be used the supporting substrate with excellent heat discharging property. In this case, it may be listed alumina, aluminum nitride, silicon carbide, Si, silicon nitride, tungsten, copper tungsten, magnesium oxide and the like.

A peeling prevention layer, preferable an oxide film, may be formed, for preventing the peeling of the optical waveguide between the supporting substrate and clad layer or reflection layer. Although the material of the oxide film is not particularly limited, it may preferably be aluminum oxide, tantalum oxide or titanium oxide. Further, its thermal conductivity may preferably be larger than that of a phosphor, and aluminum oxide is most preferred on the viewpoint.

The material of the clad layer may be a material smaller in the refractive index than the material of the optical waveguide, and the clad layer may serve also as an adhesive layer. The material of the clad layer is preferably $SiO_2$, $Al_2O_3$, $MgF_2$, $CaF_2$, or MgO. Moreover, the clad layer is preferably higher in the heat conductivity than the phosphor in such a viewpoint that the heat generated in the phosphor substrate is radiated through the support substrate, and $Al_2O_3$ and MgO are particularly preferable as such a material.

A material of the reflection film may be a metal film such as gold, aluminum, copper, silver or the like, an alloy containing the metal component, or a dielectric multilayer film. Preferably, the reflection film is composed of one or more metal selected from the group consisting of silver, gold, platinum, aluminum and the alloys thereof. If the metal film is used as the reflection film, a metal layer of Cr, Ni, Ti or the like may be formed as a buffer layer for the metal film in order to prevent the clad layer from being detached.

A bonding layer may be provided between the clad layer and the reflection film. A material of such a bonding layer is not particularly limited, but is preferably aluminum oxide, tantalum oxide, or titanium oxide. However, the bonding layer is preferably more in the heat conductivity than the phosphor, and aluminum oxide is most preferable from this viewpoint.

Such bonding layer may be present between the reflection film and supporting substrate. In this case, it may be produced according to the process of forming a bottom face-side clad layer, bottom face-side reflection film and bonding layer on the side of the optical waveguide, of forming a bonding layer on the side of the supporting substrate, and of directly bonding both bonding layers. Here, a peeling prevention layer may be present between the reflection film and bonding layer and between the supporting substrate and bonding layer.

The metal film formed on the reflection film may preferably be composed of one or more metal (s) selected from the group consisting of titanium, chromium, tantalum, nickel and the alloys thereof.

The method of film-forming the clad layer, reflection film and metal film includes, and not limited to, sputtering method, vapor deposition method, plating method and CVD method.

The metal film is then subjected to surface oxidation treatment to form the surface oxidized film and to leave the intermediate metal film between the surface oxidized film and reflection film. Here, the thickness of the intermediate metal film may preferably be 1 μm or larger on the viewpoint of preventing the corrosion of the reflection film and may preferably be 5 μm or smaller and more preferably be 3 μm or smaller on the viewpoint of cost and film-forming time duration.

Further, the surface oxidation treatment includes plasma ashing and annealing at a high temperature, and may particularly preferably be plasma ashing. Plasma ashing means a reaction of introducing oxygen into vacuum, of then generating plasma of oxygen by means of a high frequency electric source and of reacting an object with oxygen radicals. Plasma ashing has been generally used in peeling step of a photoresist or the like. The charged electric power during the plasma ashing may preferably be 200 to 400 W and the pressure of the oxygen gas may preferably be 100 to 200 Pa. The time duration of the plasma ashing may preferably be 30 to 90 minutes.

The material forming the surface oxidized film is an oxide of the metal forming the intermediate metal film functioning as an underlayer and is a composite oxide in the case that the material forming the intermediate metal film is an alloy. The thickness of the surface oxidized film may preferably be 7 nm or larger and more preferably be 8 nm or larger, on the viewpoint of protecting the intermediate layer as the underlayer and reflection film from the corrosion. Further, the thickness of the surface oxidized film is actually 10 nm or smaller in many cases.

The optical waveguide device of the present invention may be used as an optical part of passive type. Alternatively, the optical waveguide device of the present invention may be used as a wavelength converting device or a waveguide type fluorescence generating device.

The optical waveguide device of the present invention may be a non-grating type device that does not include a grating (diffraction grating) in the optical waveguide, or a grating device.

The material forming the optical waveguide may be a material which is chemically stable and of a high refractive index, and includes lithium niobate, lithium tantalate, lithium niobate-lithium tantalate solid solution, tantalum pentoxide and silicon nitride.

In the case of the waveguide type phosphor device, the optical waveguide may be composed of a phosphor. The phosphor may be phosphor glass, a monocrystal, or a polycrystal. The phosphor glass is constructed by diffusing rare earth ions in a glass serving as a base.

As the glass serving as the base, an oxide glass containing silica, boron oxide, calcium oxide, lanthanum oxide, barium oxide, zinc oxide, phosphorus oxide, aluminum fluoride, magnesium fluoride, calcium fluoride, strontium fluoride, or barium chloride may be exemplified, and YAG (yttrium aluminum garnet) may be listed.

Though the rare earth ions diffused in the glass are preferably Tb, Eu, Ce, and Nd, the rare earth ions may be La, Pr, Sc, Sm, Er, Tm, Dy, Gd, or Lu.

As the phosphor monocrystal, $Y_3Al_5O_{12}$, $Ba_5Si_{11}Al_7N_{25}$, and $Tb_3Al_5O_{12}$ are preferable. A dopant doped in the phosphor is rare earth ions such as Tb, Eu, Ce, and Nd. The phosphor is preferably a monocrystal from such a viewpoint as suppression of the thermal degradation, but even a polycrystal can decrease the heat resistance at grain boundaries and can increase the transmittance if the polycrystal is a dense body, and can thus function as the optical waveguide.

A semiconductor laser made of a GaN material high in reliability for exciting the phosphor for illumination is preferable as the light source. Moreover, a light source such as a laser array arranged in a one-dimensional form can be realized. The light source may be a super luminescent diode or a semiconductor optical amplifier (SOA).

Though a method of generating white light from the semiconductor laser and the phosphor is not particularly limited, but the following methods are conceivable.

A method of generating yellow fluorescence by blue laser and phosphor, thereby acquiring the white light.

A method of generating red and green fluorescence by blue laser and phosphor, thereby acquiring the white light.

A method of generating red, blue, and green fluorescence from blue laser or ultraviolet laser by phosphor, thereby acquiring the white light.

A method of generating blue and yellow fluorescence from blue laser or ultraviolet laser by phosphor, thereby acquiring the white light.

EXAMPLES

It was produced an optical waveguide device having the shape shown in FIGS. 3 and 4.

Specifically, an optical waveguide 2 was provided on a supporting substrate 1 composed of a 4-inch wafer having a thickness of 1 mm and of aluminum nitride by sputtering, through a reflection film 3 composed of an Ag-based alloy and a clad layer 4b composed of $Al_2O_3$. The material of the optical waveguide 2 was made YAG. A clad layer 4 of alumina was then film-formed in 8000 angstrom and a reflection film 5 of Ag was film-formed in 1000 angstrom on the surfaces of the optical waveguide 2 and supporting substrate 1. A metal film 6 of Ti was then film-formed on the reflection film 5 in a thickness of 2.56 μm. The formation of all the films was performed by sputtering.

The metal film was then subjected to ashing in a plasma ashing system at an oxygen pressure of 133 Pa and an applied electric power of 250 W. Further, the time duration of the ashing was changed as shown in table 1. Thereafter, the processing by a dicing saw was performed for exposing the end faces, followed by ultrasonic cleaning to produce a ridge-type optical waveguide structure.

TABLE 1

|  | Inventive Example 1 | Inventive Example 2 | Inventive Example 3 | Inventive Example 4 | Comparative Example 1 |
|---|---|---|---|---|---|
| Film thickness of metal film before ashing | 2.56 μm | 2.56 μm | 2.56 μm | 2.56 μm | 2.56 μm |
| Time duration of ashing | 10 min | 30 min | 60 min | 90 min | 0 |
| Film thickness of metal oxide film | 7.6 nm | 8.5 nm | 9.5 nm | 9.3 nm | None |

Further, the film thickness of the surface oxidized film (titanium oxide film) was measured by an X-ray reflectance method (XRR). Further, the photographs of the structures of the respective examples after the dicing were taken for observing the layered structures and the presence or absence of defects.

As shown in table 1, as the time duration of the ashing is longer, the thickness of the surface oxidized film composed of titanium oxide becomes larger and the film thickness takes the maximum value at the time duration of 60 minutes of the ashing treatment. Further, according to all the inventive examples, it was confirmed three-layered structure of surface oxidized film/intermediate metal film/reflection film. However, the asking treatment was not performed according to the comparative example 1.

Figure 5:
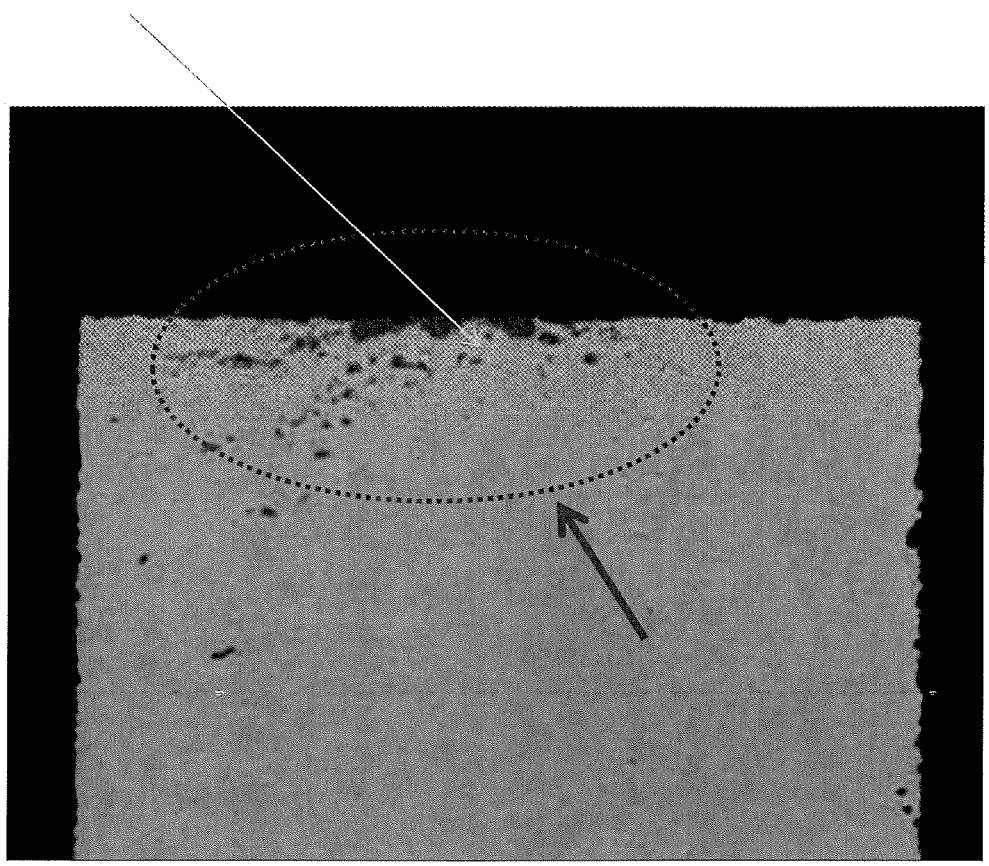
FIG. 5 is a photograph showing the vicinity of an upper face of an optical waveguide in an optical waveguide structure according to a comparative example.
Figure 6:
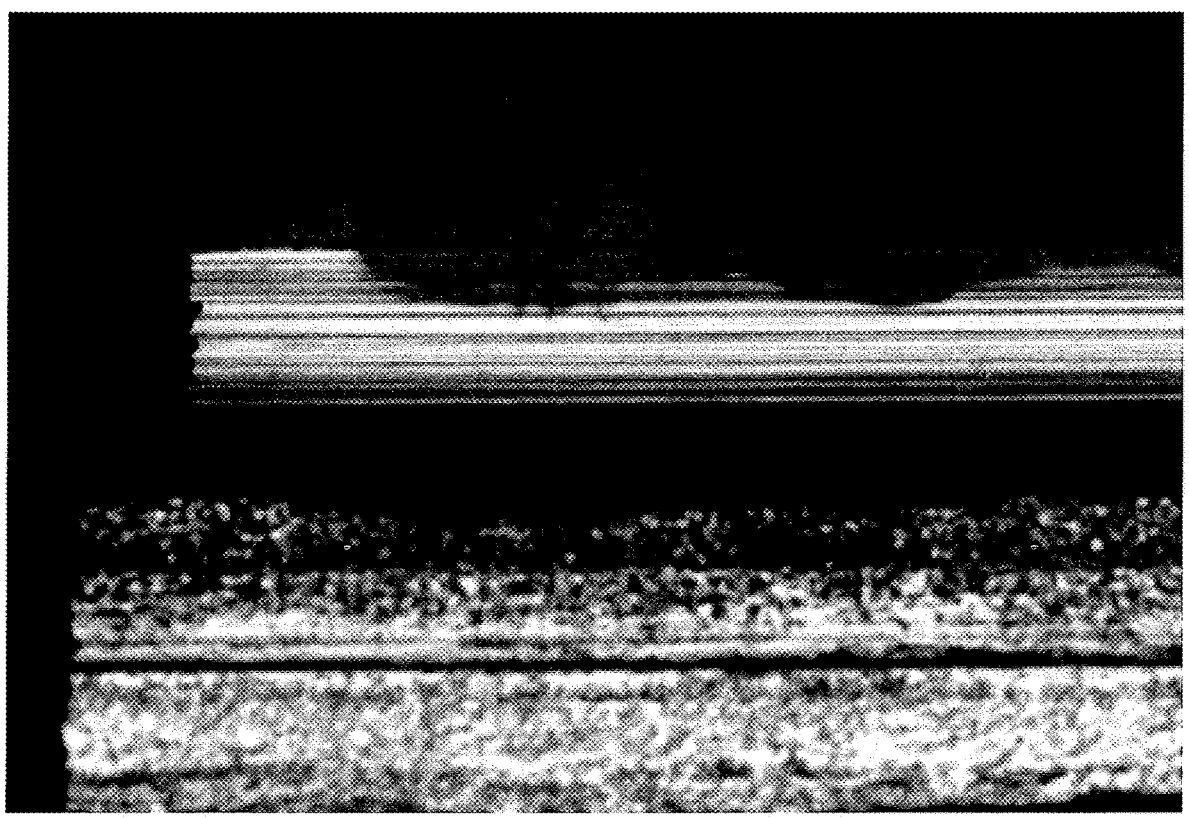
FIG. 6 is a photograph showing the vicinity of a side face of the optical waveguide in the optical waveguide structure of the comparative example.

As shown in FIG. 5, according to the comparative example 1, the upper face side of the optical waveguide was corroded with pure water to observe the disappearance of the reflection film in a region shown by an arrow. Further, as shown in FIG. 6, according to the structure of the comparative example 1, the side of the side face of the optical waveguide was corroded by pure water to observe the disappearance of the reflection film.

Figure 7:
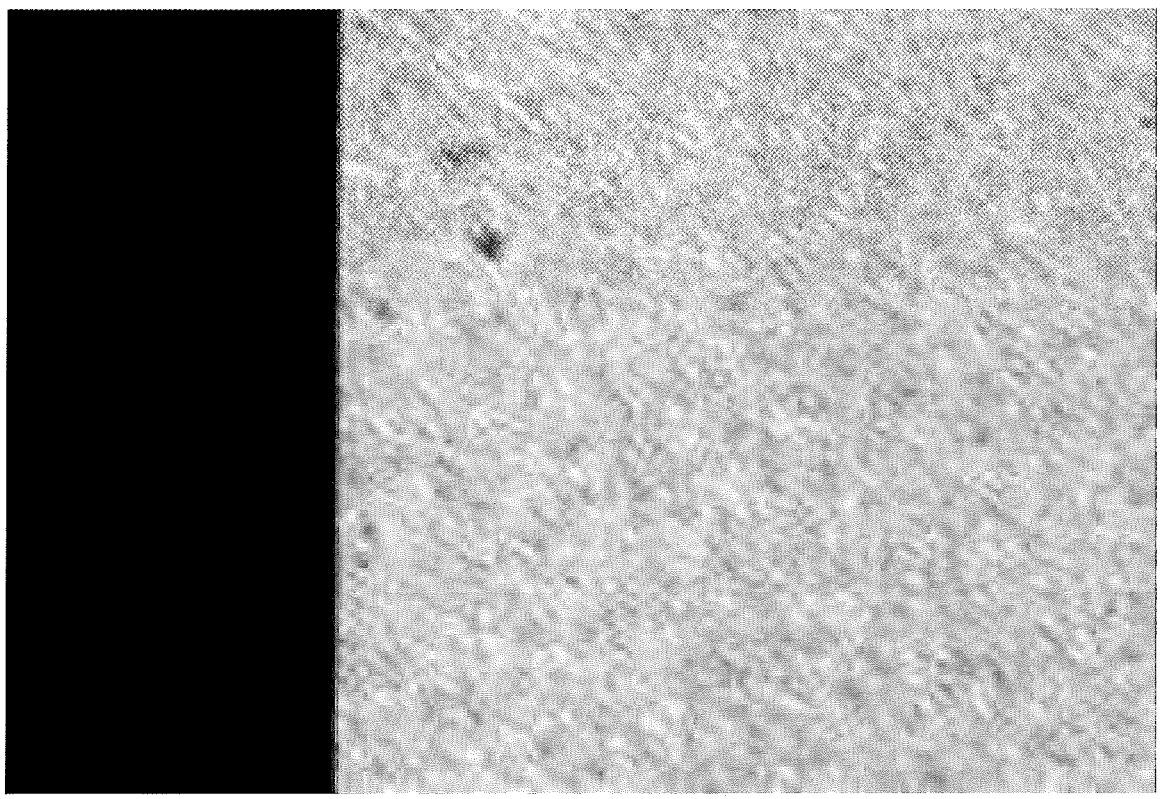
FIG. 7 is a photograph showing the vicinity of an upper face of an optical waveguide structure of the inventive example.
Figure 8:
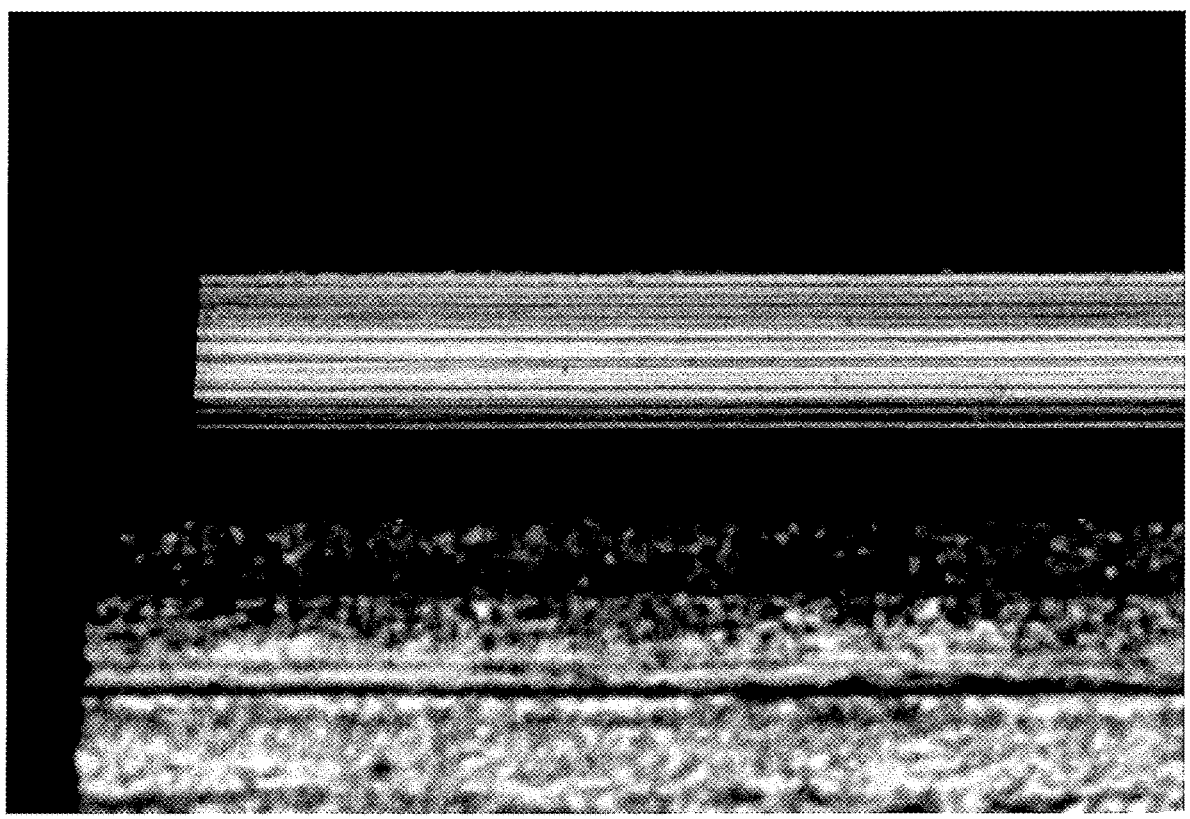
FIG. 8 is a photograph showing the vicinity of a side face of the optical waveguide, in the optical waveguide of the inventive example.

On the other hand, according to the structure of the inventive example (Ti/Ag based alloy/$Al_2O_3$), as shown in FIG. 7, the corrosion or disappearance of the reflection film was not observed on the side of the upper face of the optical waveguide, and as shown in FIG. 8, the corrosion or disappearance of the reflection film was not observed also on the side of the side face.

As other inventive examples, Ta, Ni or Cr was used as a metal component of the surface oxidized film instead of Ti, an Al based alloy was used for the reflection film, and $SiO_2$ was used for the clad layer, resulting in the similar results.

Further, according to the respective optical waveguide structures of the inventive examples 1, 2, 3 and 4, the peeling of the metal film and reflective film was not observed even after the polishing of the end faces.

The invention claimed is:

1. An optical waveguide structure comprising:
   an optical waveguide;
   a reflection film provided on said optical waveguide and reflecting a light propagating in said optical waveguide;
   a metal film provided on said reflection film; and
   a surface oxidized film provided on said metal film by surface oxidation of said metal film.

2. The optical waveguide structure of claim 1, wherein said surface oxidation comprises plasma asking.

3. The optical waveguide structure of claim 1, further comprising a clad layer provided between said optical waveguide and said reflection film.

4. The optical waveguide structure of claim 1, wherein said reflection film comprises one or more metals selected from the group consisting of silver, gold, platinum, aluminum and alloys thereof.

5. The optical waveguide structure of claim 1, wherein said metal film comprises one or more metals selected from the group consisting of titanium, chromium, tantalum, nickel and alloys thereof.

6. A fluorescence generating device comprising said optical waveguide structure of claim 1, wherein said optical waveguide comprises a phosphor propagating an excitation light to generate fluorescence.

7. A method of producing an optical waveguide structure, said method comprising:
   obtaining a part comprising an optical waveguide, a reflection film provided on said optical waveguide and reflecting a light propagating in said optical waveguide, and a metal film provided on said reflection film; and
   subjecting said metal film of said part to surface oxidation treatment to generate a surface oxidized film on said metal film.

8. The method of claim 7, wherein said surface oxidation treatment comprises plasma asking.

9. The method of claim 7, wherein said optical waveguide structure is treated with ultrapure water.

10. The method of claim 7, wherein said reflection film comprises one or more metals selected from the group consisting of silver, gold, platinum, aluminum and alloys thereof.

11. The method of claim 7, wherein said metal film comprises one or more metals selected from the group consisting of titanium, chromium, tantalum, nickel and alloys thereof.

* * * * *